United States Patent
Leibowitz et al.

(10) Patent No.: US 10,630,300 B2
(45) Date of Patent: Apr. 21, 2020

(54) DOWNSHIFT TECHNIQUES FOR OSCILLATOR WITH FEEDBACK LOOP

(71) Applicant: Apple Inc., Cupertino, CA (US)

(72) Inventors: Brian S. Leibowitz, San Francisco, CA (US); Jared L. Zerbe, Woodside, CA (US); Sanjay Pant, Santa Clara, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 16/298,803

(22) Filed: Mar. 11, 2019

(65) Prior Publication Data

US 2019/0273503 A1 Sep. 5, 2019

Related U.S. Application Data

(63) Continuation of application No. 15/146,374, filed on May 4, 2016, now Pat. No. 10,230,379.

(51) Int. Cl.
*H03L 7/093* (2006.01)
*H03B 1/00* (2006.01)
*H03L 7/08* (2006.01)
*H03L 7/085* (2006.01)
*H03L 7/099* (2006.01)

(52) U.S. Cl.
CPC ............... *H03L 7/093* (2013.01); *H03B 1/00* (2013.01); *H03L 7/08* (2013.01); *H03L 7/085* (2013.01); *H03L 7/099* (2013.01); *H03L 2207/06* (2013.01)

(58) Field of Classification Search
CPC .. H03B 1/00; H03L 7/085; H03L 7/08; H03L 7/093

USPC ................... 310/309; 333/186; 331/179, 176
See application file for complete search history.

(56) References Cited

U.S. PATENT DOCUMENTS

| | | | |
|---|---|---|---|
| 5,138,325 A | 8/1992 | Koury | |
| 7,199,672 B2 | 4/2007 | Munker et al. | |
| 7,965,068 B2 | 6/2011 | Tobin et al. | |
| 8,358,931 B2 | 1/2013 | Siepmann | |
| 8,531,245 B2 | 9/2013 | Joubert et al. | |
| 8,803,499 B2 | 8/2014 | Sreenivas et al. | |
| 8,907,643 B2 | 12/2014 | Sreenivas et al. | |
| 9,092,210 B2 | 7/2015 | Rotem et al. | |
| 9,106,340 B2 | 8/2015 | Siepmann | |
| 2006/0145776 A1* | 7/2006 | Shi | H03L 7/10 331/175 |

* cited by examiner

*Primary Examiner* — Arnold M Kinkead
(74) *Attorney, Agent, or Firm* — Kowert, Hood, Munyon, Rankin & Goetzel, P.C.

(57) ABSTRACT

Techniques are disclosed relating to rapidly downshifting the output frequency of an oscillator. In some embodiments, the oscillator is configured to operate in a closed-loop mode in which negative feedback is used to maintain a particular output frequency (e.g., in a phase-locked loop (PLL)). In some embodiments, the negative feedback loop is configured to maintain the output of the oscillator at a particular frequency based on a reference clock signal and the output of the oscillator. The nature of a negative feedback loop may render rapid frequency changes difficult, e.g., because of corrections by the loop. Therefore, in some embodiments, the loop is configured to switch to an open-loop mode in which a control input to the oscillator is fixed. In some embodiments, the loop switches to open-loop mode in response to a trigger signal and control circuitry forces the oscillator to a new target frequency.

20 Claims, 8 Drawing Sheets

Operate oscillator and feedback circuitry in a closed-loop mode in which the feedback circuitry varies a control signal to the oscillator based on the output of the oscillator and a reference signal to cause the oscillator to generate an output clock signal at a first frequency
610

In response to a trigger signal from sensor circuitry, operate the oscillator and feedback circuitry in an open-loop mode of operation in which the feedback circuitry outputs the first control signal at a fixed value which, in conjunction with the trigger signal, causes the oscillator to generate the output clock signal at a second, lower frequency
620

DOWNSHIFT TECHNIQUES FOR OSCILLATOR WITH FEEDBACK LOOP

This application is a continuation of U.S. application Ser. No. 15/146,374 (now U.S. Pat. No. 10,230,379), filed on May 4, 2016, which is incorporated by reference herein in its entirety.

BACKGROUND

Technical Field

This disclosure relates generally to clocking circuitry and more specifically to frequency downshift for feedback-controlled oscillators.

Description of the Related Art

Computing devices (especially mobile devices) sometimes experience rapid current increases (e.g., when multiple components begin operating at the same time during a burst of activity). This may cause a drop in voltage supply which may in turn cause errors in circuitry on a critical path, absent some preventative measure. Extending cycle times during such intervals may be advantageous to enable a device to recover from a current step and corresponding voltage drop. Such an adjustment may need to be performed quickly to avoid critical path errors.

Phase-locked loops are one type of circuitry used to generate clocking signals. In typical implementations, the output of a voltage-controlled oscillator (VCO) is compared with a reference signal to control the VCO in a feedback loop. This allows the VCO to output at a controlled frequency. Because of the nature of the feedback loop, however, PLL clock sources are typically unable to change frequency rapidly.

SUMMARY

Techniques are disclosed relating to rapidly downshifting the output frequency of an oscillator. In some embodiments, the oscillator is included in a negative feedback loop (e.g., in a phase-locked loop (PLL)). In some embodiments, the negative feedback loop is configured to maintain the output of the oscillator at a particular frequency based on a reference clock signal and the output of the oscillator. The nature of a negative feedback loop may render rapid frequency changes difficult, e.g., because of corrections by the loop. Therefore, in some embodiments, the loop is configured to switch to an open-loop mode in which a control input to the oscillator is fixed. In some embodiments, the loop switches to open-loop mode in response to a trigger signal and control circuitry forces the oscillator to a new target frequency. In some embodiments, the trigger signal is asserted based on characteristics of a supply voltage (e.g., in response to detecting a current step and/or voltage droop event).

In some embodiments, the loop may close subsequent to the downshift. In some embodiments, the loop may re-open subsequent to a dwell interval and may return to normal operating frequency (or another frequency) using multiple frequency steps. This may avoid causing, or substantially reduce another current step, for example, in certain situations. In some embodiments, the trigger specifies one of multiple trigger levels and the amount of frequency downshift is based on the specified level.

In various embodiments, the disclosed techniques may allow for rapid downshifting of oscillator output frequency, which may reduce switching power consumption, facilitate voltage recovery before critical path failure, prevent errors, prevent circuit damage, etc.

This specification includes references to various embodiments, to indicate that the present disclosure is not intended to refer to one particular implementation, but rather a range of embodiments that fall within the spirit of the present disclosure, including the appended claims. Particular features, structures, or characteristics may be combined in any suitable manner consistent with this disclosure.

Within this disclosure, different entities (which may variously be referred to as "units," "circuits," other components, etc.) may be described or claimed as "configured" to perform one or more tasks or operations. This formulation—[entity] configured to [perform one or more tasks]—is used herein to refer to structure (i.e., something physical, such as an electronic circuit). More specifically, this formulation is used to indicate that this structure is arranged to perform the one or more tasks during operation. A structure can be said to be "configured to" perform some task even if the structure is not currently being operated. A "clock circuit configured to generate an output clock signal" is intended to cover, for example, a circuit that performs this function during operation, even if the circuit in question is not currently being used (e.g., power is not connected to it). Thus, an entity described or recited as "configured to" perform some task refers to something physical, such as a device, circuit, memory storing program instructions executable to implement the task, etc. This phrase is not used herein to refer to something intangible.

The term "configured to" is not intended to mean "configurable to." An unprogrammed FPGA, for example, would not be considered to be "configured to" perform some specific function, although it may be "configurable to" perform that function. After appropriate programming, the FPGA may then be configured to perform that function.

Reciting in the appended claims that a structure is "configured to" perform one or more tasks is expressly intended not to invoke 35 U.S.C. § 112(f) for that claim element. Accordingly, none of the claims in this application as filed are intended to be interpreted as having means-plus-function elements. Should Applicant wish to invoke Section 112(f) during prosecution, it will recite claim elements using the "means for" [performing a function] construct.

As used herein, the term "based on" is used to describe one or more factors that affect a determination. This term does not foreclose the possibility that additional factors may affect the determination. That is, a determination may be solely based on specified factors or based on the specified factors as well as other, unspecified factors. Consider the phrase "determine A based on B." This phrase specifies that B is a factor is used to determine A or that affects the determination of A. This phrase does not foreclose that the determination of A may also be based on some other factor, such as C. This phrase is also intended to cover an embodiment in which A is determined based solely on B. As used herein, the phrase "based on" is synonymous with the phrase "based at least in part on."

DETAILED DESCRIPTION

Figure 1A:
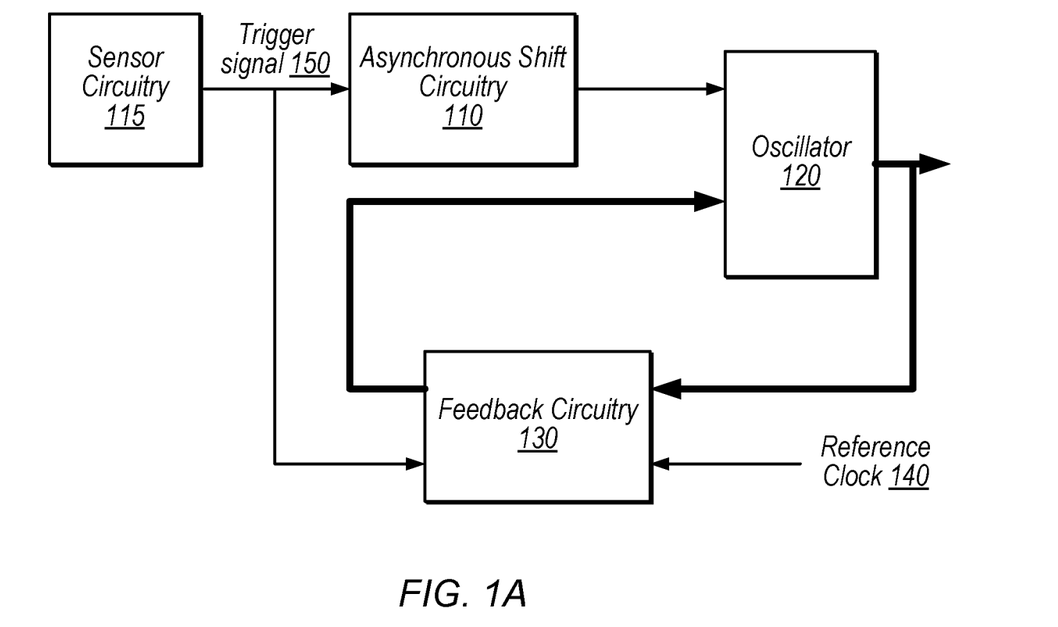
FIG. 1A is a block diagram illustrating one embodiment of an oscillator with feedback circuitry in a closed-loop mode, according to some embodiments.
Figure 1B:
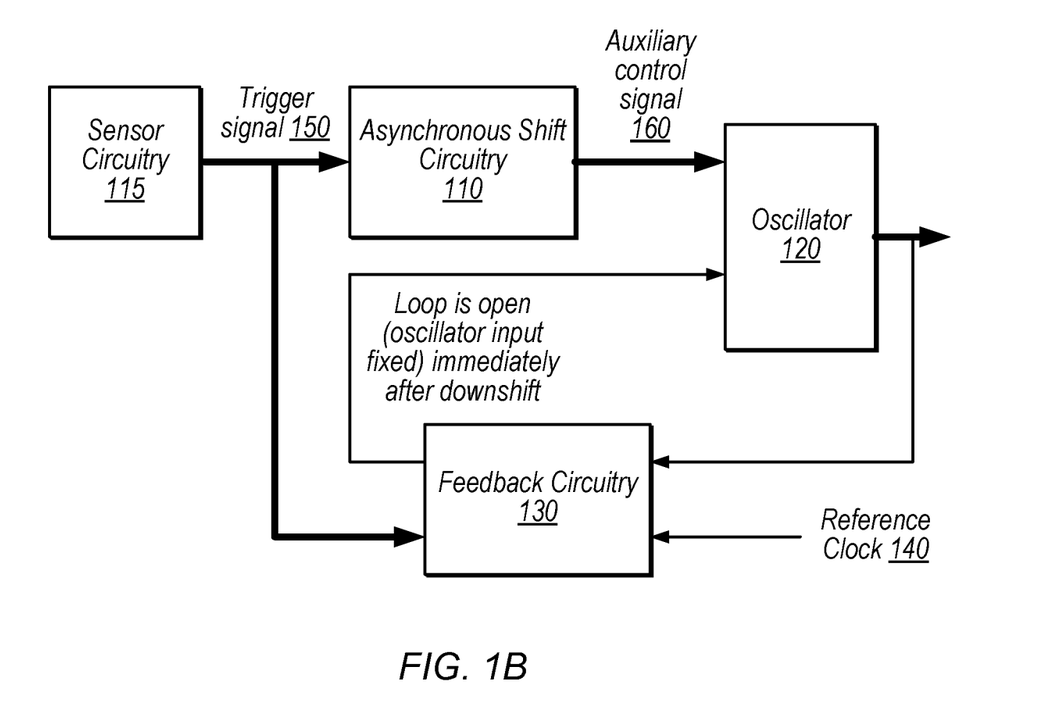
FIG. 1B is a block diagram illustrating one embodiment of an oscillator with feedback circuitry in an open-loop mode for rapid downshift, according to some embodiments.
Figure 2:
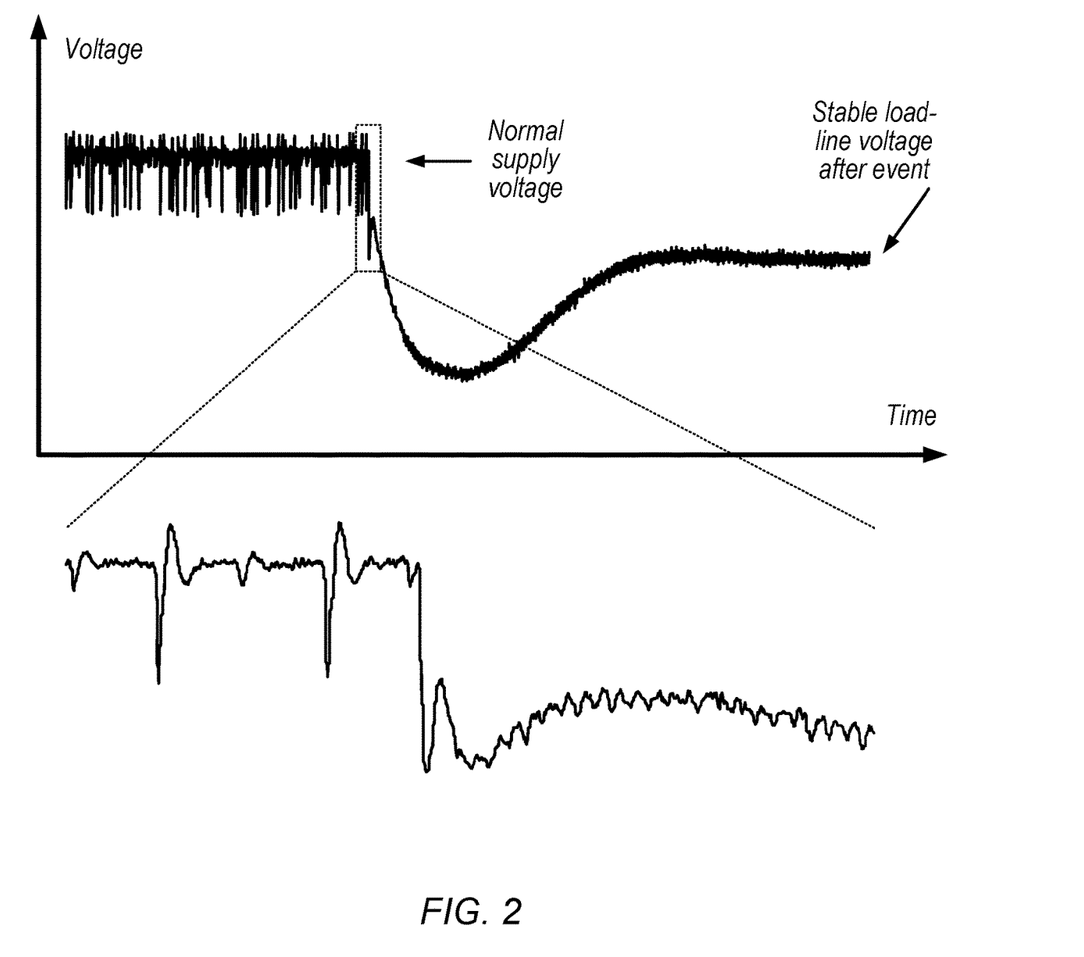
FIG. 2 is a diagram illustrating an exemplary graph of supply voltage over time during a current step event.
Figure 7:
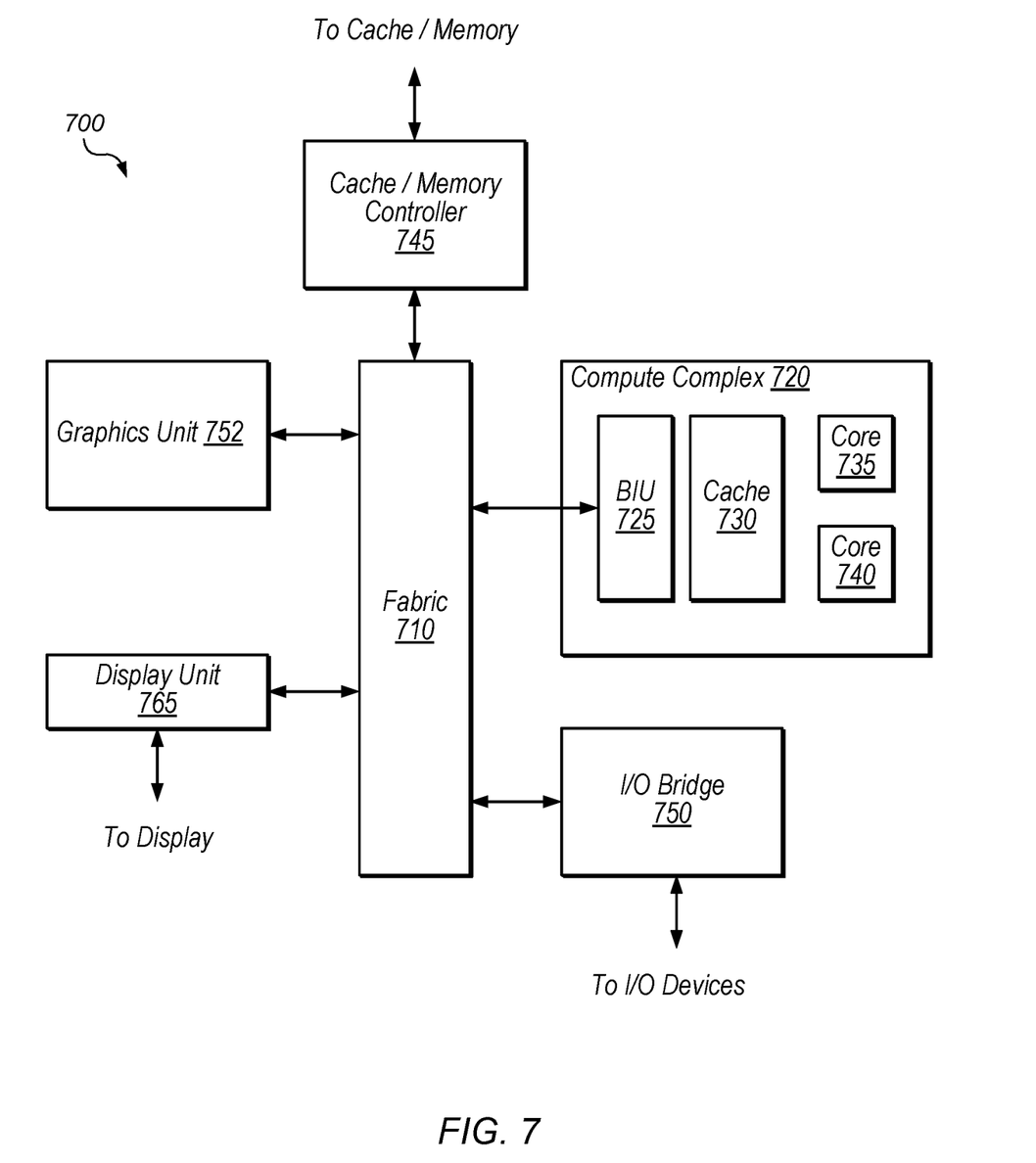
FIG. 7 is a block diagram of an exemplary device that includes one or more loop-controlled oscillators, according to some embodiments.
Figure 8:
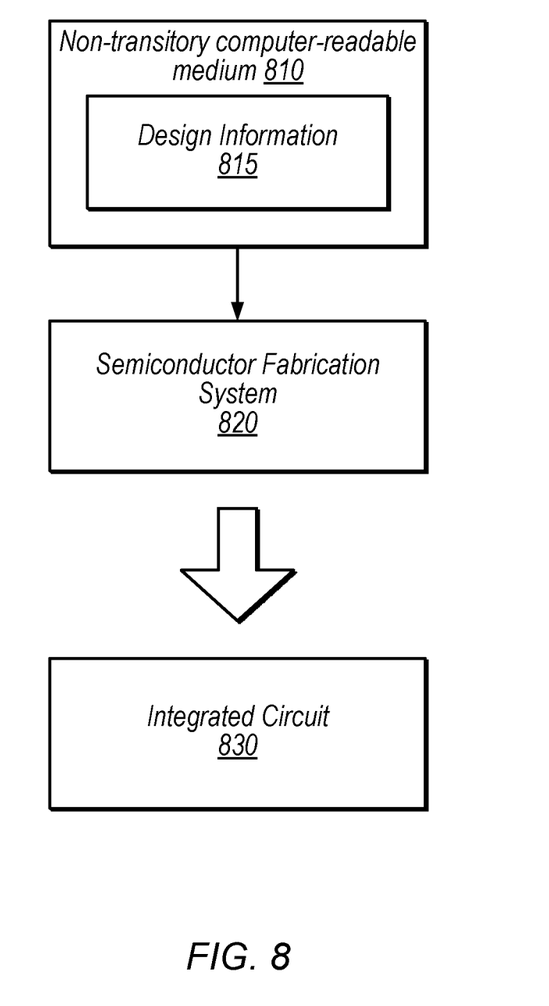
FIG. 8 is a block diagram illustrating an exemplary computer-readable medium that stores circuit design information, according to some embodiments.

This disclosure initially describes, with reference to FIGS. 1A-1B, general embodiments of a feedback-controlled oscillator with open and closed-loop modes of operation for rapid downshift. FIG. 2 shows an exemplary plot of supply voltage during a current step event. More detailed embodiments and downshift techniques are discussed with reference to FIGS. 3-6. FIG. 7 shows an exemplary device and FIG. 8 shows an exemplary computer-readable medium. In some embodiments, the disclosed techniques allow for rapid downshifting of oscillator output frequency, which may reduce switching power consumption, facilitate voltage recovery, prevent errors, prevent circuit damage, etc.

Exemplary Clock Source with Rapid Downshift

FIGS. 1A and 1B are block diagrams illustrating an exemplary device with a clock source capable of frequency downshift from a first frequency to a second, lower frequency, according to some embodiments. In some embodiments, this frequency downshift occurs rapidly in an open-loop mode, relative to changes in frequency that occur in closed-loop mode. In the illustrated embodiment, the device includes asynchronous shift circuitry 110, sensor circuitry 115, oscillator 120, and feedback circuitry 130. FIG. 1A illustrates a closed-loop mode while FIG. 1B illustrates an open-loop mode. Switching from the closed-loop mode to the open-loop mode based on trigger signal 150 may allow for rapid frequency downshift, which may reduce switching power consumption and prevent equipment damage or processing errors, e.g., during a voltage droop event. In some embodiments sensor circuitry 115 is included on the same device as the other circuit components 110, 120, and 130, whereas in some embodiments sensor circuitry may be contained in another companion device, or may have elements in both the same device and a companion device.

Oscillator 120, in the illustrated embodiment, is configured to generate an output clock signal at a frequency that is based on one or both of two inputs: 1) a feedback signal from feedback circuitry 130 and 2) an auxiliary control signal 160 from asynchronous shift circuitry 110. In some embodiments, the auxiliary control signal 160 indicates a percentage of the nominal frequency at which to generate an output signal (where the nominal frequency is the output frequency specified by the feedback signal alone). The output of oscillator 120 may be provided to various other circuitry in the illustrated device, e.g., to facilitate sequential processing with associated critical paths. In the illustrated embodiment, the output of oscillator 120 is also provided to feedback circuitry 130 for comparison with a reference clock signal 140.

Feedback circuitry 130, in the illustrated embodiment, is configured to adjust the feedback signal input to oscillator 120 based on a comparison of the output of oscillator 120 and reference clock signal 140. The output of oscillator 120 and reference clock signal 140 may have the same frequency or may have different related frequencies. In some embodiments, the relationship between the reference clock signal and the oscillator 120 output is adjustable. In some embodiments, the illustrated feedback loop, when in closed loop mode (as shown in FIG. 1A), is a negative feedback loop such that the output of oscillator 120 is maintained at a desired frequency (which may be configurable). Closed loop negative feedback loops reduce output fluctuations relative to the input reference and generally promotes stable, accurate outputs in the presence of noise or device variations. In some embodiments, feedback circuitry 130 is configured to operate in an open-loop mode (as shown in FIG. 1B) in response to assertion of trigger signal 150. The behavior of feedback circuitry 130 in open-loop mode is discussed in further detail below. Open-loop mode, refers to situations in which one or more control signals that input to the oscillator are being adjusted based on factors other than the output signal from the oscillator. For example, in open-loop mode, the control signal from feedback circuitry 130 to oscillator 120 may be frozen at a particular level or value while the signal from asynchronous shift circuitry 110 may be adjusted.

Sensor circuitry 115, in the illustrated embodiment, is configured to assert trigger signal 150 in response to detecting an event. In some embodiment, the event is based on a supply voltage (e.g., based on one or more characteristics of the supply voltage such as level, rate of change, meeting a certain threshold, dropping below a threshold a particular number of times during a time interval, weighting factors assigned to different characteristics, etc.). In other embodiments, the event may correspond to other device parameters or logically controlled device events. In some embodiments, the event is detected based on multiple different thresholds or parameters in combination. In various embodiments, sensor circuitry 115 (or another processing element) may include trigger logic configured to determine whether an event has occurred based on sensor input and/or other processor information. In some embodiments, the trigger logic is programmable.

Asynchronous shift circuitry, in the illustrated embodiment, is configured to generate an auxiliary control signal 160 in response to the trigger signal 150. The oscillator 120 may be configured to quickly lower its output frequency based on auxiliary control signal 160. In other embodiments, asynchronous shift circuitry 110 may be omitted and oscillator 120 may be configured to quickly lower its output frequency based on directly receiving trigger signal 150.

If the feedback loop shown in bold of FIG. 1A were to remain closed (such that the oscillator continued to be controlled as a function of its output) during such a downshift, the downshift would typically be inaccurate due to negative feedback from the loop filter attempting to return the oscillator to the previous frequency. Therefore, in some embodiments, feedback circuitry 130 is configured to freeze its input to oscillator 120 in response to receiving trigger signal 150. This breaks the loop, resulting in open-loop operation, and allows a rapid and stable downshift based on the trigger signal and/or auxiliary control signal 160. As one non-limiting example, the frequency may downshift from 1000 MHz to 850 MHz in less than 500 picoseconds. Thus, in various embodiments, the downshift may occur significantly faster than a clock period.

In some embodiments, feedback circuitry 130 is configured to close the loop after an interval subsequent to the trigger signal. In some embodiments, discussed in further detail below, the device is configured to gradually increase the frequency back to the original frequency (the frequency prior to the downshift) with the loop open. This may allow the device to recover from a current step appropriately, e.g., without causing another step by increasing the frequency too quickly.

Exemplary Current Step Event

FIG. 2 is a diagram illustrating an exemplary plot of supply voltage over time for a current step event (also referred to as a voltage droop event). This event may be caused by multiple components of a device being activated at the same time, for example. In the illustrated embodiment, the magnified portion of the plot (indicated using dashed lines) may have characteristics that are detectable, e.g., by sensor circuitry 115. In some embodiments, based on detecting characteristics of this portion of the plot, sensor circuitry 115 is configured to assert trigger signal 150 which may increase the clock period so that sequential logic (not explicitly shown) driven by the output clock signal will immediately operate with increased timing margin to tolerate the voltage drop without timing failures. As another effect, the severity of the voltage drop may also be muted by the reduction in clock frequency to the extent that the voltage drop is caused by circuitry that is controlled by the clock Although voltage sensor embodiments of sensor circuitry 115 are described herein, sensor circuitry 115 may include any of various types of sensors in other embodiments. In some embodiments, sensor circuitry is located on a different chip than the oscillator and sensor circuitry 115 is configured to receive a trigger signal from the off-chip sensor circuitry and forward the trigger signal as appropriate. In some embodiments, sensor circuitry 115 is logic configured to detect a particular processor state rather than a particular measurement. For example, particular processor states may be associated with current draw increases and sensor circuitry 115 may be configured to detect those states.

In the illustrated embodiment, the low point in the voltage plot may be 50 mV lower than the normal supply voltage while the load line on the right-hand portion may be 20 mV lower than the normal supply voltage. Acceptable voltage ranges may vary in different embodiments, however.

Exemplary PLL and DVCO Embodiment

Figure 3:
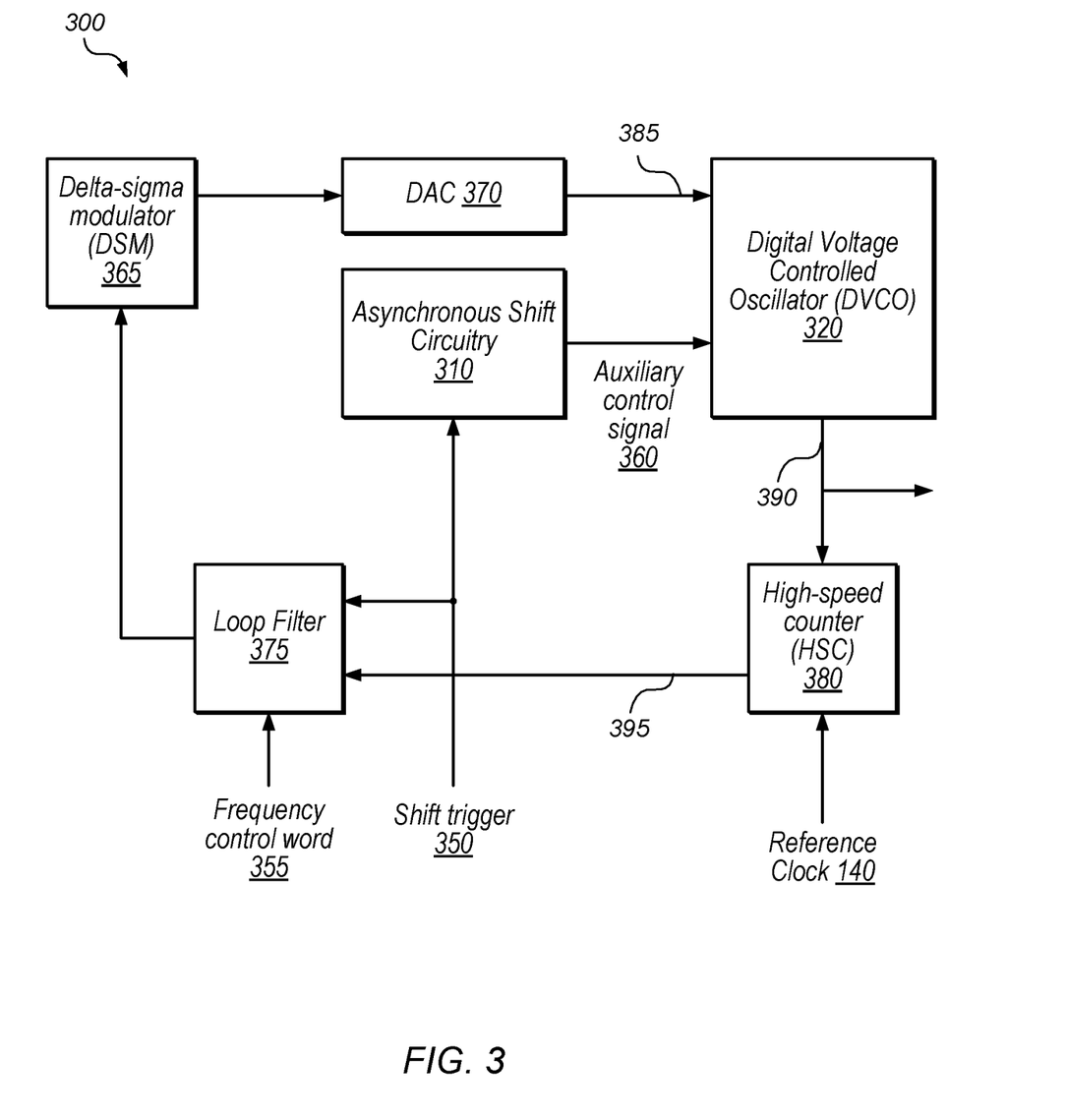
FIG. 3 is a block diagram illustrating one embodiment of PLL circuitry configured for rapid downshift based on a trigger signal, according to some embodiments.

FIG. 3 is a block diagram illustrating one embodiment of a clock source in which the oscillator is a VCO and the feedback loop is a phase-locked loop (PLL). The illustrated embodiment is discussed for exemplary purposes, but is not intended to limit the scope of the present disclosure. For example, other PLL implementations may be used in other embodiments. As another example, a frequency-locked loop (FLL) or a current-controlled oscillator may be used in other embodiments.

In the illustrated embodiment, a device 300 includes asynchronous shift circuitry 310, digital voltage controlled oscillator (DVCO) 320, high-speed counter (HSC) 380, loop filter 375, delta-sigma modulator (DSM) 365, and digital to analog converter (DAC) 370.

Asynchronous shift circuitry 310, in the illustrated embodiment, is configured to receive a shift trigger signal 350 and provide an auxiliary control signal 360 to DVCO 320 based on the shift trigger. In some embodiments, the shift trigger signal 350 is capable of specifying multiple levels to asynchronous shift circuitry 310, which in turn controls DVCO 320 to achieve different target output frequencies, e.g., depending on the received trigger level.

DVCO 320, in the illustrated embodiment, is configured to generate an output clock signal 390 at a frequency that is based on both an analog voltage signal 385 from DAC 370 and the auxiliary control signal 360, which is digital in the illustrated embodiment. In some embodiments, DVCO 320 is normally configured to generate an output signal at a nominal frequency that is based on the analog input. In some embodiments, DVCO 320 is configured to generate the output signal at some percentage of the nominal frequency (indicated by the signal from DAC 370) based on particular values of the auxiliary control signal. For example, if the analog voltage input would normally cause an output frequency of 1 GHz with no reduction, but the auxiliary control signal indicates a downshift by 20%, the DVCO 320 may output a clock signal at 800 MHz.

In some embodiments, auxiliary control signal 360 is a thermometer code (which may also be referred to as a unary code) where the number of bits of a particular polarity in the signal indicates the amount of frequency reduction. For example, for a 10-bit thermometer code, ten different reductions (which may include zero reduction) may be indicated. The reductions may be fractions, e.g., 0/32, 1/32, 2/32, 3/32, ..., 9/32 for a 10-bit code with a denominator of 32. In other embodiments, that any of various numbers of bits and/or denominators may be used. In other embodiments, other non-unary encodings may be implemented.

HSC 380, in the illustrated embodiment, is configured to count edges of the output of DVCO 320 and reference clock 140 and provide the count value 395 to loop filter 375. In some embodiments, the count value indicates a number of edges of the output of DVCO 320 that occurs between edges or cycles of reference clock 140. In some embodiments, in closed-loop mode, the output frequency of DVCO 320 is controlled to a non-integer multiple of the reference clock. In some embodiments, the multiple is programmable. The output of HSC 380 includes integer and fraction parts, in some embodiments, in order to increase precision.

Loop filter 375, in some embodiments, is a low pass filter. In some embodiments, frequency control word 355 indicates the desired output frequency of DVCO 320 and loop filter 375 is configured to drive DVCO 320 to the frequency specified by frequency control word 355. In some embodiments, loop filter 375 is configured to generate signals to freeze the output of DAC 370 at a particular value in response to shift trigger 350 being activated. In some embodiments, this is performed by blocking filter updates when shift trigger 350 is asserted. In some embodiments, once the downshift has been performed, frequency control word 355 is updated to match the target frequency after downshift (or to match a frequency near the target frequency, e.g., to allow some guard band frequency) and the loop may be closed to lock the frequency. The loop may open again in order to gradually increase the frequency.

In some embodiments, loop filter 375 is not configured to break the loop in certain situations. For example, the inaccuracy from the negative feedback until the loop filter can be adjusted for the target downshift frequency may be acceptably small. In this case, the rapid downshift may be performed by simply asserting the trigger signal and generating auxiliary control signal 360 without freezing the output of loop filter 375. This is still an open-loop mode response by the apparatus to the trigger signal (the auxiliary control signal 360 is independent of the output of the oscillator), but the PLL loop itself is not broken, in these embodiments.

Delta-sigma modulator (DSM) 365, in the illustrated embodiment, is configured to encode signals from loop filter 375 generate a stream of digital pulses and may be used to control noise when using a fractional divider to generate a desired output frequency, for example. In some embodiments, the output of DSM 365 is a multi-bit code. DAC 370 is configured to convert the pulses from DSM 365 to an analog voltage signal, in the illustrated embodiment.

By blocking updates from loop filter 375 (switching to open-loop mode) quickly after downshifting the DVCO 320 frequency, in some embodiments a rapid downshift to approximately a desired frequency is achieved (note that operation at this frequency may not be precise, because there is no feedback in the open-loop mode). As discussed above, in some embodiments, the device is configured to close the loop subsequent to the downshift to lock to a desired target downshift frequency. In some embodiments, to return to normal output frequency (or a new desired output frequency), the device is configured to return to open-loop mode and return to the desired frequency using multiple frequency steps. Examples of such operations are shown in FIG. 4.

Figure 4:
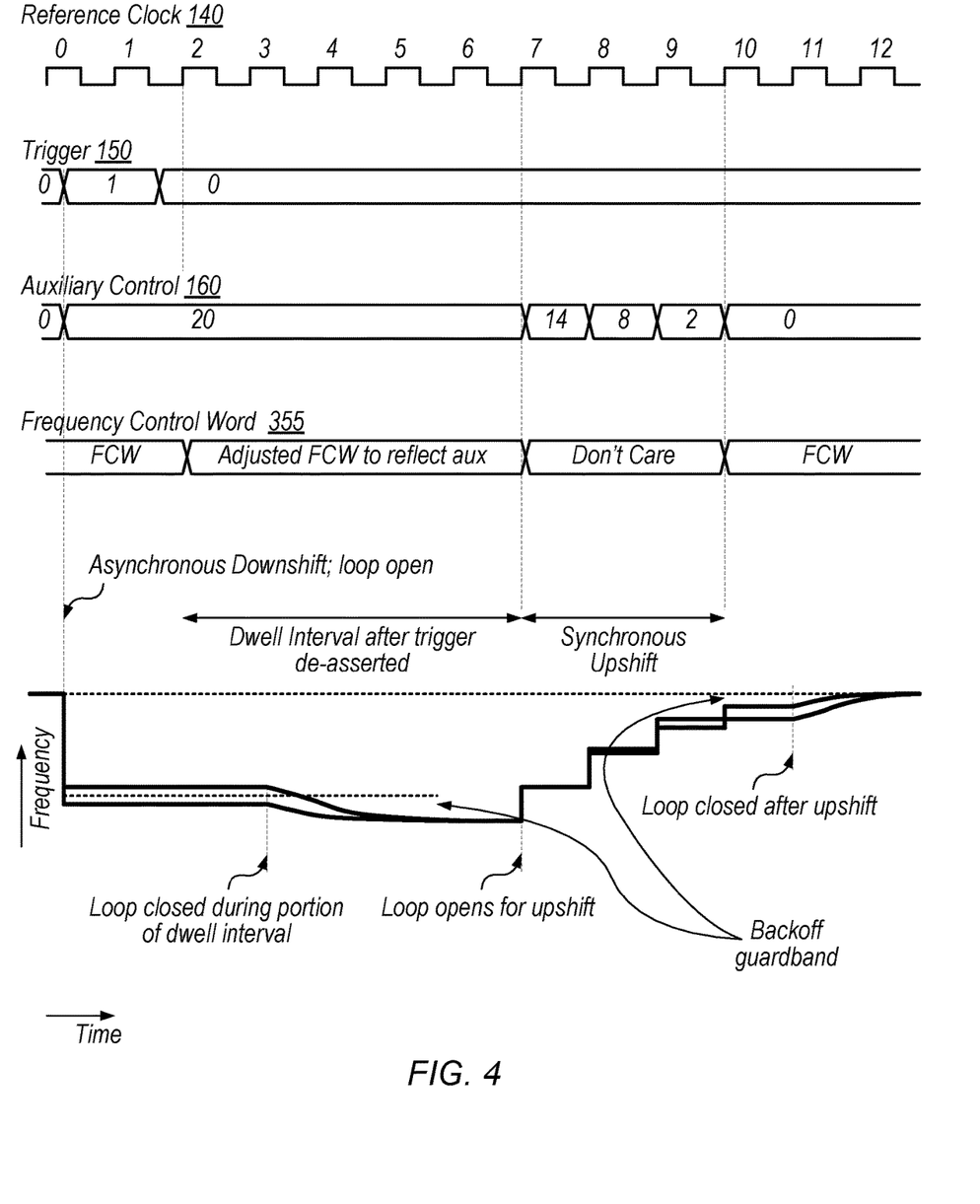
FIG. 4 is a timing diagram illustrating exemplary control signals and clock frequency over time, according to some embodiments.

FIG. 4 is a diagram illustrating exemplary control signaling and corresponding changes in the frequency output of DVCO 320 over time, according to some embodiments. The bottom portion of the figure plots the output frequency of DVCO 320 over time while the upper portion shows the values of four control signals at corresponding times. In the illustrated example, the signals include reference clock 140, trigger 150, auxiliary control 160, and a frequency control word 355. In the frequency plot, the upper horizontal dashed line indicates an initial operating frequency and the lower horizontal dashed line indicates a target frequency after initial downshift.

During the first cycle of reference clock 140, in the illustrated embodiment, trigger circuitry asserts trigger signal 150. For example, sensor circuitry 115 may assert the trigger in response to detecting certain voltage conditions. In response, the device rapidly downshifts the frequency of the output of DVCO 320 from the operating frequency to near a target downshift frequency. The multiple values shown for the frequency subsequent to the asynchronous downshift (and during upshift) in FIG. 4 indicate that the frequency may vary from the target frequency because the downshift mechanism is open loop and negative feedback is not being used to lock the frequency. Therefore, the actual downshift frequency may vary from the desired downshift frequency, but because extra margin is being given to critical paths during the downshift, any uncertainty can be accounted for by increasing the size of the downshift. Because the downshift mechanism is open loop the downshift may occur quite rapidly, e.g., in less than 200, 300, 500 picoseconds, etc. in some embodiments.

In the illustrated embodiment, the device keeps the frequency near the downshift frequency for at least an interval subsequent to assertion of the trigger. In the illustrated embodiment, the device begins measuring a dwell interval (e.g., using a timer) beginning at de-assertion of the trigger. In other embodiments, the dwell interval may be measured beginning at assertion of the trigger or at some other appropriate point in time related to the downshift. In some embodiments, the device adjusts frequency control word 355 at some point between the downshift and beginning of upshift. This may occur before or after the dwell interval begins, in some embodiments. In the illustrated embodiment, the device locks the frequency below the nominal downshift frequency in order to leave a back-off guard band in the frequency.

In the illustrated embodiment, the auxiliary control signal 160 indicates a downshift of 20/N using a thermometer code value of 20 and a denominator N, which may vary in different embodiments or modes (note that the illustrated frequency plot is not drawn to scale). Therefore, the target downshift frequency, in the illustrated example, is the operating frequency reduced by a fraction 20/N of the initial frequency.

In response to the end of the dwell interval, in the illustrated embodiment, the device opens the loop again and begins synchronous upshift back to the normal operating frequency (in some situations, frequency may be upshifted back to other desired frequencies that are higher or lower than the frequency prior to the downshift). The upshift is "synchronous" in some embodiments, in the sense that the speed at which the upshift occurs is controlled by a reference clock (e.g., reference clock 140). This may allow control of the recovery speed, e.g., based on the severity of a voltage droop event. In the illustrated embodiment, the frequency control word 355 value does not matter during open-loop operation, and the device increases the value of auxiliary control signal 160 over multiple steps to increase the frequency. In the illustrated embodiment, reductions in nominal frequency of 14/N, 8/N, and 2/N are implemented based on auxiliary control signal 160, resulting in a gradual frequency increase. In the illustrated embodiment, the device closes the loop after upshift to lock the frequency to the initial operating frequency. The steps in FIG. 4 during upshift are shown with multiple potential values of the frequency to illustrate that the actual frequency may vary due to open-loop operation.

Figure 5:
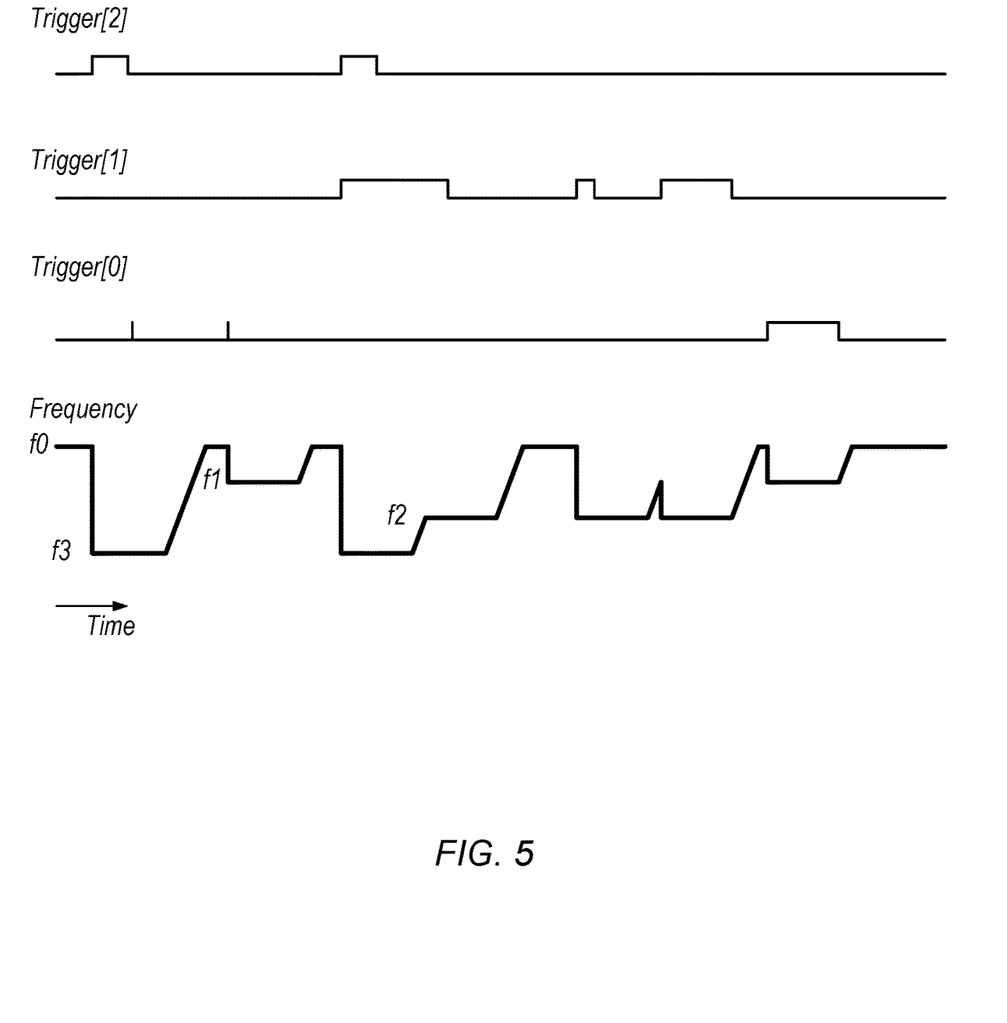
FIG. 5 is a diagram illustrating multiple different downshift modes at different points in time, according to some embodiments.

FIG. 5 is a diagram illustrating exemplary frequencies during operation based on multiple trigger signals. In the illustrated embodiment, trigger signal 150 is a three-bit signal representing triggers at three different priorities, where trigger[2] is the highest priority trigger and trigger [0] is the lowest priority trigger. In some embodiments, a lower priority trigger has no effect if a higher-priority trigger has been asserted. In the illustrated embodiment, higher-priority triggers cause greater frequency downshifts than relatively lower-priority triggers. In particular, trigger[2] specifies a downshift to frequency f3, trigger[1] specifies a downshift for frequency f2 and trigger[0] specifies a downshift to frequency f1 (where f3 is lower than f2 which is lower than f1). Therefore, in some embodiments, asynchronous shift circuitry 310 is configured to adjust auxiliary control signal 360 based on which trigger signal(s) are asserted. In some embodiments, the amount of downshift for each trigger is programmable, e.g., by an operating system, by an application execution on a device, by a BIOS, by firmware, etc. In some embodiments, certain triggers may be programmable by certain types of programs and not by others. Different triggers may be asserted by the same sensor circuitry (e.g., based on the severity of a measurement of a particular type such as voltage) or by different sensor circuitry (e.g., with one trigger controlled based on temperature and another based on voltage).

When trigger[2] is first asserted, in the illustrated embodiment, the output frequency of DVCO 320 quickly drops from frequency f0 to frequency f3. Subsequently, the frequency returns to f0. The upshifts in the example are illustrated as linear increases to simplify explanation, but each upshift may be performed using multiple steps in open-loop mode, e.g., as shown in FIG. 4. Note that trigger

[0] is asserted after trigger[2] has been de-asserted but it has no effect in the illustrated example because a higher-priority trigger is already asserted.

Subsequent to the first return to f0, trigger[0] is asserted for a second time and causes the frequency to drop from f0 to f1. Subsequently, trigger[2] and trigger[1] are asserted at the same time, causing a downshift to f3. After a dwell interval for subsequent to de-assertion trigger[2], the frequency returns from f3 to f2 (rather than f0) because trigger[1] is still asserted. After the second assertion of trigger[1], in the illustrated example, the frequency does not return all the way to f0 after the dwell time because trigger[1] is asserted again (for a third time) before upshift to f0 is completed.

The different trigger levels may be asserted based on changes in sensor measurements. For example, trigger[0] then trigger [1] then trigger [2] may be asserted in turn as a droop in supply voltage becomes greater in order to increase the reduction in frequency. In some embodiments, different types of sensor measurements may cause different trigger levels.

In some embodiments, the same trigger signal (e.g., trigger signal 150 or a given trigger level such as trigger[0]) may be configured to cause different frequency shift amounts at different times. For example, the shift amount for a given trigger signal assertion may be based on the current system state (e.g., performance state, number of active units, etc.). In some embodiments, the shift amount for a given trigger is configurable by software. The configuration may occur when the system is operating and/or in an idle state.

In some embodiments, a device is configured to perform dynamic voltage and frequency management (DVFM) and operate one or more processors in a plurality of different voltage and frequency states. U.S. Pat. No. 9,304,573 filed Jun. 21, 2013, and assigned to the same assignee as this application, discusses exemplary techniques for dynamic voltage and frequency management based on the number of processors at a particular operating point. In some embodiments, downshifting features are enabled in some DVFM states and disabled in other DVFM states. In some embodiments, the trigger thresholds and/or amount of downshift for each trigger is different for different DVFM states (where a DVFM state may correspond to a particular voltage and frequency operating point). For example, different DVFM states may have different proportional acceptable noise levels in the voltage supply and therefore may benefit from different trigger thresholds. In various embodiments, trigger thresholds and/or amount of downshift for each trigger are programmable, e.g., by an operating system or by firmware.

The illustrated example shows exemplary interaction between multiple trigger priorities according to some embodiments. In other embodiments, different relationships, numbers of triggers, frequencies, dwell intervals, etc. may be used. The illustrated example is included to facilitate explanation but is not intended to limit the scope of the present disclosure. In some embodiments, with an adequate number of triggers, downshift frequencies, and dwell intervals, the clocking system is designed to effectively follow periodic or aperiodic supply voltage waveforms, which may allow for co-optimization of the combined power supply and clocking system for efficiency, power, performance, cost, or other design parameters.

Exemplary Method

Figure 6:
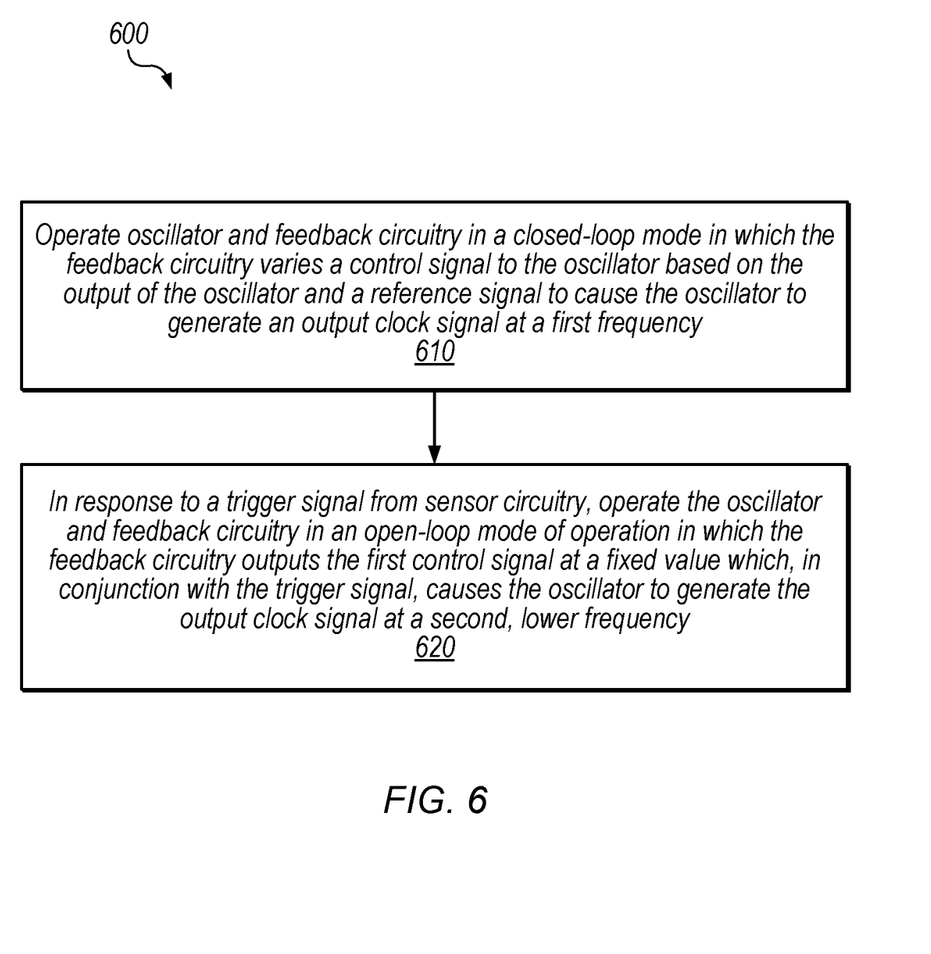
FIG. 6 is a flow diagram illustrating a method for downshifting a loop-controlled oscillator, according to some embodiments.

FIG. 6 is a flow diagram illustrating one exemplary embodiment of a method 600 for operating an oscillator. The method shown in FIG. 6 may be used in conjunction with any of the computer systems, devices, elements, or components disclosed herein, among other devices. In various embodiments, some of the method elements shown may be performed concurrently, in a different order than shown, or may be omitted. Additional method elements may also be performed as desired. Flow begins at 610.

At 610, in the illustrated embodiment, an oscillator (e.g., oscillator 120) and feedback circuitry (e.g., feedback circuitry 130) are operated in an open loop mode. In the illustrated embodiment, the feedback circuitry varies a control signal to the oscillator based on the output of the oscillator and a reference signal (e.g., from reference clock 140) to cause the oscillator to generate an output clock signal at a first frequency.

At 620, in the illustrated embodiment, the oscillator and feedback circuitry are operated in a closed-loop mode in response to a trigger signal from sensor circuitry. In the illustrated embodiment, the feedback circuitry outputs the first control signal at a fixed value which, in conjunction with the trigger signal, causes the oscillator to generate the output clock signal at a second, lower frequency. The transition to the open-loop mode may be referred to as a downshift and may occur rapidly after assertion of the trigger signal. This may prevent equipment damage and/or computing errors, in some embodiments, by reducing power consumption by circuitry driven by the output of the oscillator, in some embodiments.

In some embodiments, the method includes operating in the closed-loop mode subsequent to the downshift and controlling the oscillator to continue outputting near the lower frequency. In some embodiments, the method includes upshifting from the lower frequency to a desired output frequency using multiple intermediate frequency steps and at least a portion of the upshift is performed in the open-loop mode. In some embodiments this is performed after a pre-determined dwell interval, the duration of which may be programmable.

The disclosed techniques may be preferable, in some embodiments, to cycle swallowing (which may involve removing edges of certain clock cycles), e.g., because the amount of time in each cycle may be moderately extended using the disclosed techniques to increase critical path timing margin with a small frequency change. In some embodiments, cycle swallowing may also be implemented (e.g., for other purposes) and may be used in conjunction with the disclosed techniques. In such embodiments, the clock period is increased by the frequency downshift and some clock cycles are also swallowed.

Exemplary Device

Referring now to FIG. 7, a block diagram illustrating an exemplary embodiment of a device 700 is shown. In some embodiments, elements of device 700 may be included within a system on a chip. In some embodiments, device 700 may be included in a mobile device, which may be battery-powered. Therefore, power consumption by device 700 may be an important design consideration. In the illustrated embodiment, device 700 includes fabric 710, compute complex 720 input/output (I/O) bridge 750, cache/memory controller 745, graphics unit 752, and display unit 765.

Fabric 710 may include various interconnects, buses, MUX's, controllers, etc., and may be configured to facilitate communication between various elements of device 700. In some embodiments, portions of fabric 710 may be configured to implement various different communication protocols. In other embodiments, fabric 710 may implement a single communication protocol and elements coupled to fabric 710 may convert from the single communication protocol to other communication protocols internally.

In the illustrated embodiment, compute complex 720 includes bus interface unit (BIU) 725, cache 730, and cores 735 and 740. In various embodiments, compute complex 720 may include various numbers of processors, processor cores and/or caches. For example, compute complex 720 may include 1, 2, or 4 processor cores, or any other suitable number. In one embodiment, cache 730 is a set associative L2 cache. In some embodiments, cores 735 and/or 740 may include internal instruction and/or data caches. In some embodiments, a coherency unit (not shown) in fabric 710, cache 730, or elsewhere in device 700 may be configured to maintain coherency between various caches of device 700. BIU 725 may be configured to manage communication between compute complex 720 and other elements of device 700. Processor cores such as cores 735 and 740 may be configured to execute instructions of a particular instruction set architecture (ISA) which may include operating system instructions and user application instructions.

Cache/memory controller 745 may be configured to manage transfer of data between fabric 710 and one or more caches and/or memories. For example, cache/memory controller 745 may be coupled to an L3 cache, which may in turn be coupled to a system memory. In other embodiments, cache/memory controller 745 may be directly coupled to a memory. In some embodiments, cache/memory controller 745 may include one or more internal caches.

As used herein, the term "coupled to" may indicate one or more connections between elements, and a coupling may include intervening elements. For example, in FIG. 7, graphics unit 752 may be described as "coupled to" a memory through fabric 710 and cache/memory controller 745. In contrast, in the illustrated embodiment of FIG. 7, graphics unit 752 is "directly coupled" to fabric 710 because there are no intervening elements.

Graphics unit 752 may include one or more processors and/or one or more graphics processing units (GPU's). Graphics unit 752 may receive graphics-oriented instructions, such as OPENGL®, Metal, or DIRECT3D® instructions, for example. Graphics unit 752 may execute specialized GPU instructions or perform other operations based on the received graphics-oriented instructions. Graphics unit 752 may generally be configured to process large blocks of data in parallel and may build images in a frame buffer for output to a display. Graphics unit 752 may include transform, lighting, triangle, and/or rendering engines in one or more graphics processing pipelines. Graphics unit 752 may output pixel information for display images. In the some embodiments, graphics unit 752 includes a programmable shader core.

Display unit 765 may be configured to read data from a frame buffer and provide a stream of pixel values for display. Display unit 765 may be configured as a display pipeline in some embodiments. Additionally, display unit 765 may be configured to blend multiple frames to produce an output frame. Further, display unit 765 may include one or more interfaces (e.g., MIPI® or embedded display port (eDP)) for coupling to a user display (e.g., a touchscreen or an external display).

I/O bridge 750 may include various elements configured to implement: universal serial bus (USB) communications, security, audio, and/or low-power always-on functionality, for example. I/O bridge 750 may also include interfaces such as pulse-width modulation (PWM), general-purpose input/output (GPIO), serial peripheral interface (SPI), and/or inter-integrated circuit (I2C), for example. Various types of peripherals and devices may be coupled to device 700 via I/O bridge 750.

In some embodiments, various elements of device 700 are clocked by oscillators such as oscillator 120 or DVCO 320. The disclosed techniques may reduce switching power consumption in device 700, prevent damage to components of device 700, etc.

Exemplary Computer-Readable Medium

The present disclosure has described various exemplary circuits in detail above. It is intended that the present disclosure cover not only embodiments that include such circuitry, but also a computer-readable storage medium that includes design information that specifies such circuitry. Accordingly, the present disclosure is intended to support claims that cover not only an apparatus that includes the disclosed circuitry, but also a storage medium that specifies the circuitry in a format that is recognized by a fabrication system configured to produce hardware (e.g., an integrated circuit) that includes the disclosed circuitry. Claims to such a storage medium are intended to cover, for example, an entity that produces a circuit design, but does not itself fabricate the design.

FIG. 8 is a block diagram illustrating an exemplary non-transitory computer-readable storage medium that stores circuit design information, according to some embodiments. In the illustrated embodiment semiconductor fabrication system 820 is configured to process the design information 815 stored on non-transitory computer-readable medium 810 and fabricate integrated circuit 830 based on the design information 815.

Non-transitory computer-readable medium 810, may comprise any of various appropriate types of memory devices or storage devices. Medium 810 may be an installation medium, e.g., a CD-ROM, floppy disks, or tape device; a computer system memory or random access memory such as DRAM, DDR RAM, SRAM, EDO RAM, Rambus RAM, etc.; a non-volatile memory such as a Flash, magnetic media, e.g., a hard drive, or optical storage; registers, or other similar types of memory elements, etc. Medium 810 may include other types of non-transitory memory as well or combinations thereof. Medium 810 may include two or more memory mediums which may reside in different locations, e.g., in different computer systems that are connected over a network.

Design information 815 may be specified using any of various appropriate computer languages, including hardware description languages such as, without limitation: VHDL, Verilog, SystemC, SystemVerilog, RHDL, M, MyHDL, etc. Design information 815 may be usable by semiconductor fabrication system 820 to fabrication at least a portion of integrated circuit 830. The format of design information 815 may be recognized by at least one semiconductor fabrication system 820. In some embodiments, design information 815 may also include one or more cell libraries which specify the synthesis and/or layout of integrated circuit 830.

Semiconductor fabrication system 820 may include any of various appropriate elements configured to fabricate integrated circuits. This may include, for example, elements for depositing semiconductor materials (e.g., on a wafer, which may include masking), removing materials, altering the shape of deposited materials, modifying materials (e.g., by doping materials or modifying dielectric constants using ultraviolet processing), etc. Semiconductor fabrication system 820 may also be configured to perform various testing of fabricated circuits for correct operation.

In various embodiments, integrated circuit 830 is configured to operate according to a circuit design specified by design information 815, which may include performing any of the functionality described herein. For example, integrated circuit 830 may include any of various elements shown in FIGS. 1A, 1B, 3, and/or 7. Further, integrated circuit 830 may be configured to perform various functions described herein in conjunction with other components. For example, integrated circuit 830 may be coupled to voltage supply circuitry that is configured to provide a supply voltage (e.g., as opposed to including a voltage supply itself). Further, the functionality described herein may be performed by multiple connected integrated circuits.

As used herein, a phrase of the form "design information that specifies a design of a circuit configured to . . . " does not imply that the circuit in question must be fabricated in order for the element to be met. Rather, this phrase indicates that the design information describes a circuit that, upon being fabricated, will be configured to perform the indicated actions or will include the specified components.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of this disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

What is claimed is:

1. An apparatus, comprising:
    an oscillator configured to generate an output clock signal based on one or more control signals;
    feedback circuitry configured to control the oscillator based on the output clock signal; and
    sensor circuitry configured to output a trigger signal;
    wherein the apparatus is configured to use the oscillator to provide the output clock signal to processor circuitry, wherein the processor circuitry includes one or more pipelines configured to process program instructions of one or more applications based on the output clock signal in both:
        a closed-loop mode in which the feedback circuitry is configured to vary at least one of the one or more control signals based on both the output of the oscillator and a reference signal to cause the oscillator to generate the output clock signal at a first frequency; and
        an open-loop mode in which the oscillator generates the output clock signal at a second frequency that is lower than the first frequency, without feedback based on output of the oscillator;
    wherein the apparatus is configured to transition from the closed-loop mode to the open-loop mode in response to the trigger signal.

2. The apparatus of claim 1, wherein the apparatus is further configured to, after a dwell interval subsequent to the trigger signal, upshift from the second frequency to a desired output frequency using multiple intermediate frequency steps, wherein at least a portion of the upshift is performed in the open-loop mode.

3. The apparatus of claim 1, further comprising:
    asynchronous shift circuitry configured to generate an auxiliary control signal in response to the trigger signal, wherein the oscillator is configured to generate the output clock signal at the second frequency to have a fraction of a frequency indicated by the one or more control signals, wherein the fraction is specified by the auxiliary control signal.

4. The apparatus of claim 1, wherein the oscillator and the feedback circuitry are included in a phase-locked loop (PLL).

5. The apparatus of claim 1, wherein the oscillator is a voltage controlled oscillator (VCO).

6. The apparatus of claim 1, wherein, in the open-loop mode, the feedback circuitry is configured to output the one or more control signals at one or more predetermined values.

7. The apparatus of claim 1, wherein the sensor circuitry is configured to monitor a voltage level of a supply voltage, wherein the supply voltage is provided to circuitry that operates based on the output clock signal.

8. The apparatus of claim 1, wherein the sensor circuitry is logic circuitry configured to assert the trigger signal based on detecting particular processor state.

9. A method, comprising:
    operating an oscillator and feedback circuitry in a closed-loop mode in which the feedback circuitry varies one or more control signals based on both the output of the oscillator and a reference signal to cause the oscillator to generate an output clock signal at a first frequency;
    in response to a trigger signal from sensor circuitry, operating the oscillator in an open-loop mode of operation in which the oscillator generates the output clock signal at a second frequency that is lower than the first frequency, without feedback based on output of the oscillator; and
    processing program instructions of one or more applications using one or more pipelines in both the closed-loop mode and the open-loop mode while the one or more pipelines are clocked by the output clock signal.

10. The method of claim 9, further comprising:
    after a dwell interval subsequent to the trigger signal, upshifting from the second frequency to a desired output frequency using multiple intermediate frequency steps, wherein at least a portion of the upshift is performed in the open-loop mode.

11. The method of claim 9, wherein operating the oscillator in the open-loop mode is based on an auxiliary control signal that indicates a fraction of the frequency indicated by the one or more control signals at which the oscillator is to generate the output clock signal.

12. The method of claim 9, further comprising outputting, by the feedback circuitry the one or more control signals at one or more predetermined values in the open-loop mode.

13. The method of claim 9, further comprising monitoring, by the sensor circuitry, a voltage level of a supply voltage provided to the circuitry that is clocked by the output clock signal.

14. A non-transitory computer readable storage medium having stored thereon design information that specifies a circuit design in a format recognized by a fabrication system that includes a processor that is configured to process the design information, wherein the fabrication system is configured to fabricate, based on the processing, a hardware integrated circuit that includes circuitry configured to operate according to the circuit design, wherein the circuitry includes:

an oscillator configured to generate an output clock signal based on one or more control signals;

feedback circuitry configured to control the oscillator based on the output clock signal; and sensor circuitry configured to output a trigger signal;

wherein the circuit is configured to use the oscillator to provide the output clock signal to processor circuitry, wherein the processor circuitry includes one or more pipelines configured to process program instructions of one or more applications based on the output clock signal in both:

a closed-loop mode in which the feedback circuitry is configured to vary at least one of the one or more control signals based on both the output of the oscillator and a reference signal to cause the oscillator to generate the output clock signal at a first frequency; and an open-loop mode in which the oscillator generates the output clock signal at a second frequency that is lower than the first frequency, without feedback based on output of the oscillator;

wherein the circuit is configured to transition from the closed-loop mode to the open-loop mode in response to the trigger signal.

15. The non-transitory computer readable storage medium of claim 14, wherein the circuit is further configured to, after a dwell interval subsequent to the trigger signal, upshift from the second frequency to a desired output frequency using multiple intermediate frequency steps, wherein at least a portion of the upshift is performed in the open-loop mode.

16. The non-transitory computer readable storage medium of claim 14, wherein the circuit further comprises:

asynchronous shift circuitry configured to generate an auxiliary control signal in response to the trigger signal, wherein the oscillator is configured to generate the output clock signal at the second frequency to have a fraction of a frequency indicated by the one or more control signals, wherein the fraction is specified by the auxiliary control signal.

17. The non-transitory computer readable storage medium of claim 14, wherein the oscillator and the feedback circuitry are included in a phase-locked loop (PLL).

18. The non-transitory computer readable storage medium of claim 14, wherein, in the open-loop mode, the feedback circuitry is configured to output the one or more control signals at one or more predetermined values.

19. The non-transitory computer readable storage medium of claim 14, wherein the sensor circuitry is configured to monitor a voltage level of a supply voltage, wherein the supply voltage is provided to circuitry that operates based on the output clock signal.

20. The non-transitory computer readable storage medium of claim 14, wherein the sensor circuitry is logic circuitry configured to assert the trigger signal based on detecting particular processor state.

* * * * *